(12) United States Patent
Baskett

(10) Patent No.: US 7,397,288 B2
(45) Date of Patent: Jul. 8, 2008

(54) FAN OUT BUFFER AND METHOD THEREFOR

(75) Inventor: Ira E. Baskett, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 50 days.

(21) Appl. No.: 11/084,643

(22) Filed: Mar. 21, 2005

(65) Prior Publication Data

US 2006/0208771 A1    Sep. 21, 2006

(51) Int. Cl.
   *H03K 3/00* (2006.01)
(52) U.S. Cl. ............................ 327/108; 327/295
(58) Field of Classification Search ............... 327/108
   See application file for complete search history.

(56) References Cited

U.S. PATENT DOCUMENTS 5,805,006 A * 9/1998 Sutardja et al. ............. 327/336
5,825,819 A * 10/1998 Cogburn .................... 375/257
6,043,704 A    3/2000 Yoshitake
6,188,281 B1 * 2/2001 Smith et al. ................ 330/252
6,338,144 B2 * 1/2002 Doblar et al. .............. 713/400
6,640,309 B2 * 10/2003 Doblar et al. .............. 713/400
2002/0158659 A1 * 10/2002 Suzuki et al. ............... 326/30

FOREIGN PATENT DOCUMENTS

JP         4-373160        12/1992

* cited by examiner

*Primary Examiner*—Kenneth B. Wells
*Assistant Examiner*—Ryan C Jager
(74) *Attorney, Agent, or Firm*—Robert F. Hightower

(57) ABSTRACT

In one embodiment, a fan out buffer has the inputs of a plurality of output followers connected to the output of a plurality of distribution gates.

17 Claims, 2 Drawing Sheets

FAN OUT BUFFER AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures to build fan out buffers such as fan out buffers for clock distribution networks for various parts of a system. In most embodiments, the fan out buffers used parallel matched paths to try and generate multiple matched clock signals from one clock input signal. It was important to minimize skew between the clock signals from the multiple paths so that the output clock signals were precisely matched in time. However, various parameter mismatches occurred due to process variations, voltage drops on buses, interaction during operation, and other mismatches that resulted in small amounts of skew between the output clock signals. The skew affected the-operation of the system using the clock signals from the fan out buffers. The skew usually caused the system to have to run slower than desired to prevent erroneous system operation.

Accordingly, it is desirable to have a fan out buffer that reduces clock skew.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain NPN transistors, a person of ordinary skill in the art will appreciate that complementary devices are also possible in accordance with the present invention.

DETAILED DESCRIPTION OF THE DRAWINGS

Figure 1:
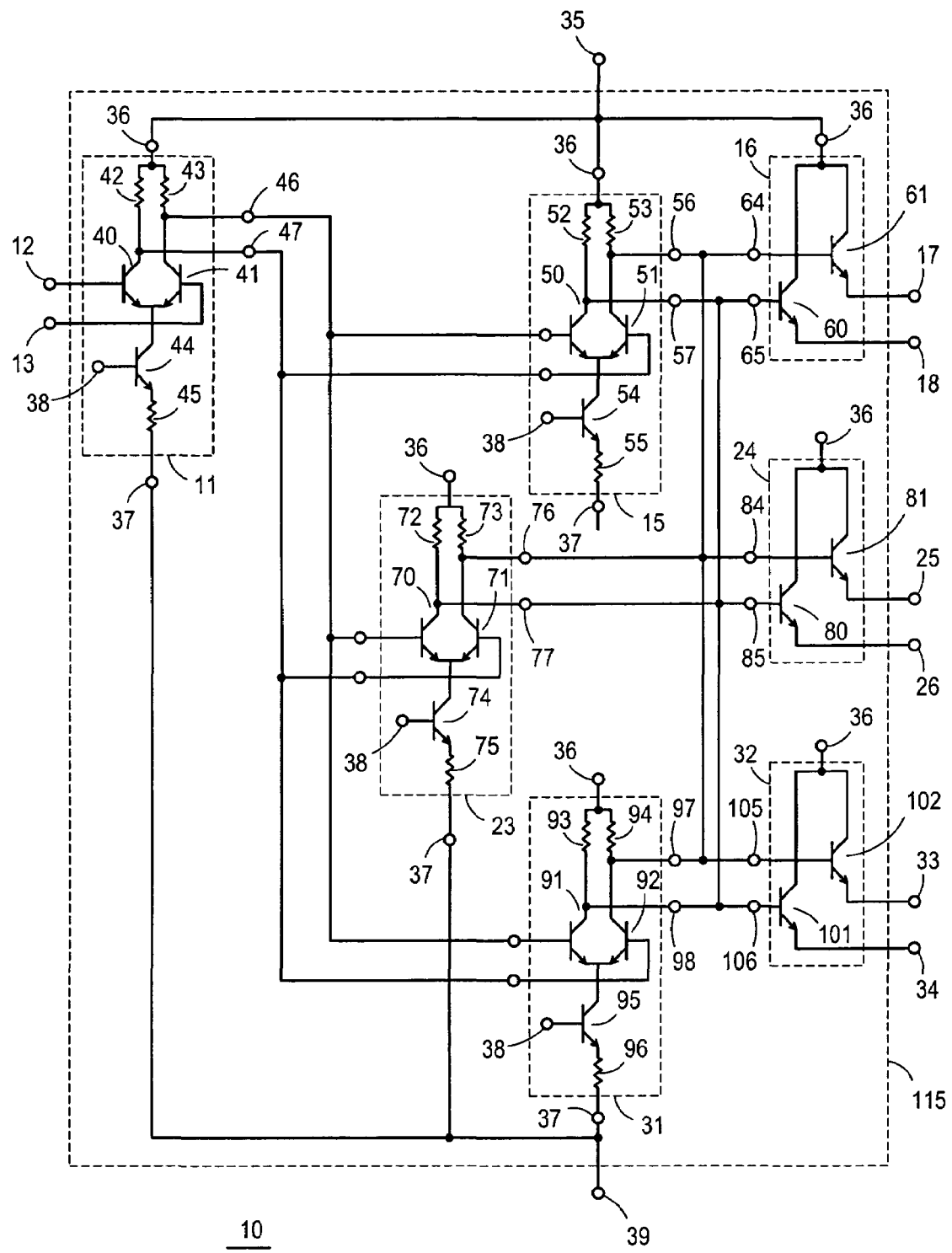
FIG. 1 schematically illustrates an embodiment of a portion of a fan out buffer in accordance with the present invention.

FIG. 1 schematically illustrates an embodiment of a portion of a fan out buffer 10 that minimizes skew between output signals on a plurality of outputs of buffer 10. Buffer 10 includes an input receiver 11, a plurality of distribution gates including distribution gates 15, 23, and 31, and a plurality of output followers including output followers 16, 24, and 32. Input receiver 11 receives a signal, such as a clock signal, and forms an output signal that is representative of the received signal. The received signal typically is from an external source. The output of receiver 11 is connected to the inputs of the plurality of distribution gates. The distribution gates are connected in parallel in order to form a plurality of signals that are substantially similar to the signal received on the input of receiver 11. The impedance of the conductors that connect the output of receiver 11 to the inputs of the plurality of distribution gates typically is matched in order to minimize skew between the signals received on the inputs of the distribution gates. An output of each distribution gate typically is connected to an input of an output follower that generates an output signal substantially equal to the output signal received from the distribution gate. However, the output signal of the output follower typically is shifted by the threshold voltage of the output follower. Additionally, the input of the output follower is shorted to a corresponding input of each other output follower in order to reduce skew between the input signals of the plurality of output followers thereby minimizing skew between the output signals on the outputs of the output followers.

In the preferred embodiment, receiver 11 is a differential receiver formed from bipolar differential amplifiers, for example an emitter coupled logic (ECL) gate, having inputs 12 and 13 and outputs 46 and 47. Additionally, each of distribution gates 15, 23, and 31 are differential distribution gates formed from bipolar differential amplifiers, for example ECL gates. Each distribution gate includes two bipolar transistors coupled as a differential pair, corresponding collector resistors, and a current source formed from a bipolar transistor and a series resistor. Each differential distribution gate has a pair of differential inputs and a pair of differential outputs. Each differential output is connected to an emitter follower that includes a bipolar transistor having a collector connected to a power source through a series collector resistor and an emitter that forms the output of the emitter follower. Each of output followers 16, 24, and 32 include a pair of emitter followers with each emitter follower connected to one of the differential outputs of a corresponding distribution gate. The inputs of all the emitter followers that are connected to the positive output of a differential distribution gate are shorted together in order to minimize skew between the signals received on the inputs of the positive emitter followers. Similarly, all of the inputs of the emitter followers that are connected to the compliment output of the distribution gates are shorted together in order to minimize skews between the signals received on the inputs of the complementary emitter followers. Preferably, the conductors that short the inputs of the emitter followers together are positioned as close as possible to the base electrode of the emitter follower. Shorting all of the corresponding inputs together reduces variations in the timing of the input signals due to effects such as metal drop variations, capacitance delays, input loading, noise, and crosstalk. Since all of the bases of the corresponding emitter followers are connected together, all of the input signals should be the same as each other, thus, the output signals should all be the same.

In order to implement this functionality of buffer 10, input 12 of buffer 10 is connected to an input of receiver 11 and to a base of a transistor 40 of the differential pair of receiver 11. Input 13 of buffer 10 is connected to a second input of receiver 11 and to a base of a transistor 41 of the differential pair of receiver 11. An emitter of transistor 41 is commonly connected to an emitter of transistor 40 and to a collector of a current source transistor 44 of receiver 11. A base of transistor 44 is connected to a bias input 38 of receiver 11, and an emitter of transistor 44 is connected to a first terminal of a current source resistor 45 of receiver 11. A second terminal of resistor 45 is connected to a power return 39 of buffer 10 through a common power return 37. A collector of transistor 40 is connected to output 47 and to a first terminal of a collector resistor 42 of receiver 11. A second terminal of resistor 42 is commonly connected to a first terminal of a resistor 43 of receiver 11, a power input 35 of buffer 10 through a common power input 36. A second terminal of resistor 43 is commonly connected to output 46 and a collector of transistor 41. A first input of gate 15 is commonly connected to output 46, a first input of gate 23, and a first input of gate 31. A second input of gate 15 is commonly connected to output 47, a second input of gate 23, and a second input of gate 31. A base of a transistor 50 of the differential pair of gate 15 is connected to the first input of gate 15 and a base of a second transistor 51 of the differential pair of gate 15 is connected to the second input of gate 15. An emitter transistor 50 is commonly connected to an emitter of transistor 51 and a collector of a current source transistor 54 of gate 15. A base of transistor 54 is connected to bias input 38, and an emitter of transistor 54 is connected to a first terminal of a current source resistor 55 of gate 15. A second terminal of resistor 55 is connected to return 37. A collector of transistor 50 is commonly connected to an output 57 of gate 15 and a first terminal of a collector resistor 52 of gate 15. The second terminal of resistor 52 is connected to a first terminal of a collector resistor 53 of gate 15 and power input 36. A second terminal of resistor 53 is connected to an output 56 of gate 15 and to a collector of transistor 51. A base of a transistor 70 of the differential pair of gate 23 is connected to the first input of gate 23 and a base of a second transistor 71 of the differential pair of gate 23 is connected to the second input of gate 23. The collector of transistor 70 is commonly connected to an output 77 of gate 23 and to a first terminal of a collector resistor 72 of gate 23. A second terminal of resistor 72 is connected to a first terminal of a collector resistor 73 of gate 23 and to input 36. A second terminal of resistor 73 is connected to a second output 76 of gate 23 and to a collector of transistor 71. An emitter of transistor 71 is commonly connected to the emitter of transistor 70 and to a collector of a current source transistor 74 of gate 23. A base of transistor 74 is connected to bias input 38, and an emitter of transistor 74 is connected to a first terminal of a current source resistor 75 of gate 23. A second terminal of resistor 75 is connected to return 37. A base of a transistor 91 of gate 31 is connected to the first input of gate 31 and a base of a second transistor 92 of the differential pair of gate 31 is connected to the second input of gate 31. An emitter of transistor 92 is commonly connected to an emitter of transistor 91 and to a collector of a current source transistor 95 of gate 31. A base of transistor 95 is connected to bias input 38 and an emitter of transistor 95 is connected to a first terminal of a current source resistor 96 of gate 31. A second terminal of resistor 96 is connected to return 37. A collector of transistor 91 is commonly connected to an output 98 of gate 31 and to a first terminal of a collector resistor 93 of gate 31. A second terminal of resistor 93 is commonly connected to input 36 and to a first terminal of a collector resistor 94 of gate 31. A second terminal of resistor 94 is commonly connected to an output 97 of gate 31 and to a collector of transistor 92. A base of a transistor 61 of follower 16 is connected to a first input 64 of follower 16 and a base of a transistor 60 of follower 16 is connected to a second input 65 of follower 16. A collector of transistor 61 is commonly connected to input 36 and to a collector of transistor 60. An emitter of transistor 61 is connected to an output 17 of buffer 10 and an emitter of transistor 60 is connected to an output 18 buffer 10. A base of a transistor 81 of follower 24 is connected to a first input 84 of follower 24 and a base of a second transistor 80 of follower 24 is connected to a second input 85 of follower 24. A collector of transistor 81 is connected to input 36 and to a collector of transistor 80. An emitter of transistor 81 is connected to an output 25 of buffer 10 and an emitter of transistor 80 is connected to an output 26 of buffer 10. A base of a transistor 102 of follower 32 is connected to a first input 105 of follower 32 and a base of a transistor 101 of follower 32 is connected to a second input 106 of follower 32. A collector of transistor 102 is connected to input 36 and to a collector of transistor 101. An emitter of transistor 102 is connected to an output 33 of buffer 10 and an emitter of transistor 101 is connected to an output 34 of buffer 10.

Figure 2:
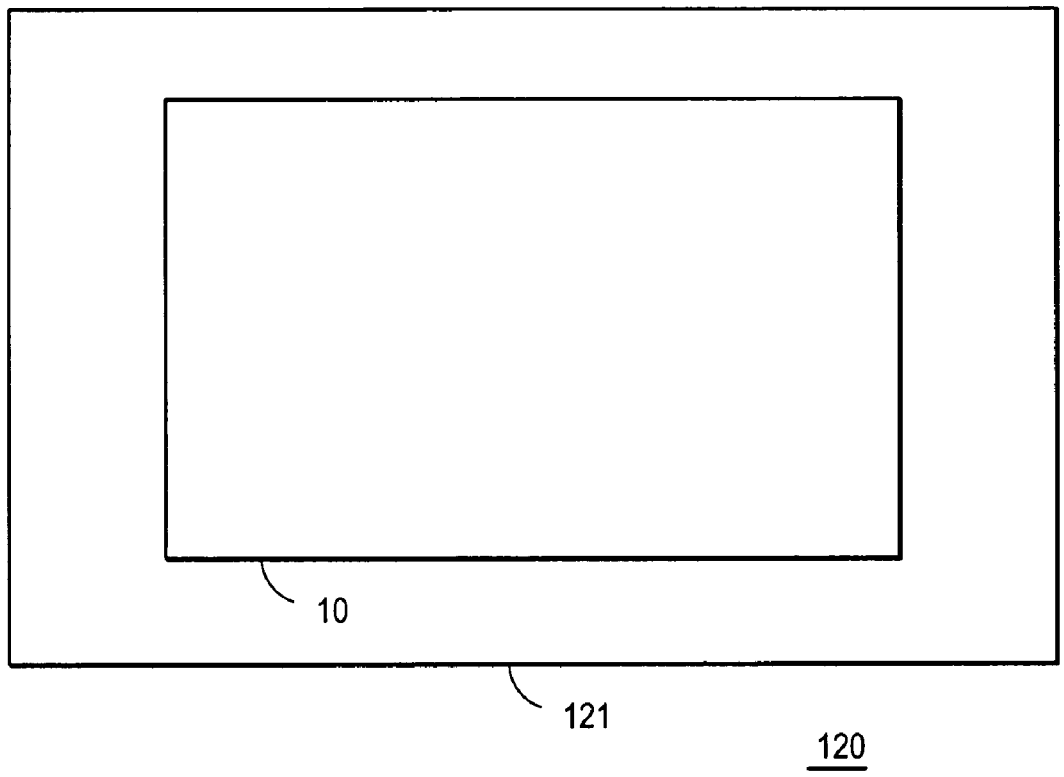
FIG. 2 schematically illustrates an enlarged plan view of a semiconductor device that includes the fan out buffer of FIG. 1 and FIG. 2 in accordance with the present invention.

In one embodiment, buffer 10 is formed on a semiconductor die that is assembled into a semiconductor package 115 that is illustrated by a dashed box in FIG. 2. Inputs 12 and 13, power input 35, power return 39, and outputs 17, 18, 25, 26, 33, and 34 are all terminals of the semiconductor package.

Although buffer 10 is described with differential input receivers and differential distribution gates, those skilled in the art realize that the differential receiver and the differential distribution gates could be a single ended amplifiers. For example, each could be a differential amplifier with one input connected to a bias voltage and the second input connected to receive the input signal. Additionally, those skilled in the art will also appreciate that the bipolar transistors could be replaced by MOS transistors and that the output followers could be source followers.

Although buffer 10 is illustrated with one distribution gate in each path, those skilled in the art will appreciate that several distribution gates could be connected in series for each path or that some of the series distribution gates could drive other parallel distribution paths such as in a tree structure.

FIG. 2 schematically illustrates an enlarged plan view of a portion of an embodiment of a semiconductor device 120 that is formed on a semiconductor die 121. Buffer 10 is formed on die 121. Die 121 may also include other circuits that are not shown in FIG. 2 for simplicity of the drawing. Buffer 10 and device 120 are formed on die 121 by semiconductor manufacturing techniques that are well known to those skilled in the art.

In view of all of the above, it is evident that a novel device and method is disclosed. Included, among other features, is forming a fan out buffer having output followers and configuring at least a first set of the output followers with the inputs shorted together.

While the invention is described with specific preferred embodiments, it is evident that many alternatives and variations will be apparent to those skilled in the semiconductor arts. More specifically the invention has been described for a particular NPN transistor structure, although the method is directly applicable to other bipolar transistors, as well as to MOS, BiCMOS, and other transistor structures. Additionally, the word "connected" is used throughout for clarity of the description, however, it is intended to have the same meaning as the word "coupled". Accordingly, "connected" should be interpreted as including either a direct connection or an indirect connection.

The invention claimed is:
1. A fan-out buffer comprising:
a first differential amplifier coupled to receive an input signal and responsively form a first output signal on a first output;
a second differential amplifier coupled in parallel with the first differential amplifier to receive the input signal and responsively form a second output signal on a second output;
a first output follower coupled to the first differential amplifier to receive the first output signal and coupled to the second differential amplifier to receive the second output signal;

a second output follower coupled to the first differential amplifier to receive the first output signal and coupled to the second differential amplifier to receive the second output signal, the second output follower having an output coupled to a first output terminal of the fan-out buffer; and a third output follower coupled to the first differential amplifier to receive the first output signal and coupled to the second differential amplifier to receive the second output signal.

2. The fan-out buffer of claim 1 wherein the first differential amplifier and the second differential amplifier are bipolar differential amplifiers.

3. The fan-out buffer of claim 2 wherein the first output follower is an emitter follower.

4. The fan-out buffer of claim 2 wherein a base of the first output follower is coupled to a collector of a first differential transistor of the first differential amplifier and to a collector of a first differential transistor of the second differential amplifier.

5. The fan-out buffer of claim 4 further including a base of a second output follower coupled to the base of the first output follower.

6. The fan-out buffer of claim 1 wherein the first differential amplifier includes a second output coupled to the second output follower and to a fourth output follower.

7. A method of forming a fan-out buffer comprising:
configuring a plurality of distribution gates to receive an input signal and configuring each distribution gate of the plurality of distribution gates to responsively form a first output signal on a first output of each distribution gate of the plurality of distribution gates and form a second output signal on a second output of each distribution gate of the plurality of distribution gates;

configuring a plurality of output followers having first and second control inputs to receive the output signal from the plurality of distribution gates and responsively form output signals of the fan-out buffer; and coupling the first output of each distribution gate to the first control input of the plurality of output followers.

8. The method of claim 7 wherein configuring the plurality of distribution gates to receive the input signal includes configuring an ECL distribution gate of the plurality of distribution gates to receive the input signal.

9. The method of claim 8 wherein configuring the ECL distribution gate to receive the input signal includes configuring the ECL distribution gate to receive the input signal as a differential input signal.

10. The method of claim 8 wherein configuring the ECL distribution gate to receive the input signal includes coupling a gate of an emitter follower transistor to at least one output of each ECL distribution gate and coupling an output of the emitter follower transistor to an output of the fan-out buffer wherein the emitter follower is one of the plurality of output followers.

11. The method of claim 8 wherein configuring the plurality of output followers includes coupling a plurality of emitter followers to receive at least one output from each ECL distribution gate.

12. The method of claim 8 wherein configuring the plurality of output followers includes coupling control inputs of a first plurality of output emitter followers to a first set of outputs of each ECL distribution gate and coupling a second plurality of output emitter followers to a second set of outputs of each ECL distribution gate wherein the first and second plurality of emitter followers are a portion of the plurality of output followers and wherein the first set of outputs of each ECL distribution gate is at least a portion of the output of the distribution gate.

13. A method of forming a fan-out buffer comprising:
forming a plurality of distribution gates having at least one output for each distribution gate;
forming a first plurality of output followers having at least one control input; and
coupling the at least one control input of each output follower of the first plurality of output followers to the one output of all distribution gates of the plurality of distribution gates to receive an output signal from all distribution gates of the plurality of distribution gates.

14. The method of claim 13 further including coupling a second plurality of output followers to a second output of each distribution gate.

15. The method of claim 13 wherein forming the plurality of distribution gates having at least one output for each distribution gate includes forming a plurality of ECL distribution gates of the plurality of distribution gates and coupling at least one emitter follower of the plurality of output followers to receive the output signal from each ECL distribution gate.

16. The method of claim 15 wherein forming the plurality of ECL distribution gates and coupling at least one emitter follower to receive the output signal from each ECL distribution gate includes coupling a gate of the emitter follower to a collector of a first differential transistor of each ECL distribution gate.

17. The method of claim 15 wherein forming the plurality of ECL distribution gates and coupling at least one emitter follower to receive the output signal from each ECL distribution gate includes coupling a gate of a plurality of emitter followers to a collector of a first differential transistor of each ECL distribution gate.

* * * * *